United States Patent
Obata et al.

(10) Patent No.: US 6,985,042 B2
(45) Date of Patent: Jan. 10, 2006

(54) MAGNETRON

(75) Inventors: Hideyuki Obata, Kamifukuoka (JP); Naoki Tsuji, Kamifukuoka (JP)

(73) Assignee: New Japan Radio Co., Ltd., Tokyo (JP)

( * ) Notice: Subject to any disclaimer, the term of this patent is extended or adjusted under 35 U.S.C. 154(b) by 191 days.

(21) Appl. No.: 10/658,411

(22) Filed: Sep. 10, 2003

(65) Prior Publication Data

US 2004/0061562 A1 Apr. 1, 2004

(30) Foreign Application Priority Data

Sep. 26, 2002 (JP) .......................... 2002-280200

(51) Int. Cl.
*H03B 9/10* (2006.01)

(52) U.S. Cl. .................. 331/91; 331/86; 315/39.51; 315/39.53; 313/333; 219/761; 219/702

(58) Field of Classification Search ................. 219/702, 219/761; 331/91, 86; 315/39.51, 39.53; 313/333
See application file for complete search history.

(56) References Cited

U.S. PATENT DOCUMENTS

| 4,855,645 A |   | 8/1989 | Kinuno et al. | ............ 315/39.71 |
| 5,049,782 A | * | 9/1991 | Aiga et al. | ............ 315/39.51 |
| 5,635,798 A |   | 6/1997 | Ogura et al. | ............ 315/39.71 |

FOREIGN PATENT DOCUMENTS

EP 0 797 234 9/1997

JP 6-290712 10/1994

OTHER PUBLICATIONS

Copy of Great Britain Patent Office Action with Search Report for corresponding Great Britain Patent Application No. GB 0322495.3 dated Mar. 26, 2004.

* cited by examiner

*Primary Examiner*—Arnold Kinkead
(74) *Attorney, Agent, or Firm*—Armstrong, Kratz, Quintos, Hanson & Brooks, LLP

(57) ABSTRACT

The object to the present invention is to provide a magnetron which can reduce spurious oscillation such as the $\pi-1$ mode which presents a problem particularly in magnetrons and can reduce spurious radiations without placing filters. The magnetron of the present invention includes an anode 1 formed by plural vanes 12 in such a manner that inner ends 12 are radially extended toward the center of the anode shell 11 from the inner wall of a cylindrical anode shell, and a cathode 2 provided at the center of the anode 1. The magnetron of the present invention further includes a pair of pole pieces 4 provided in such a manner that a magnetic field can be applied on the interaction space 2 where the inner ends 12a of the vanes 12 and the cathode 2 face with each other. At least one of the pair of pole pieces is provided in such a manner that in a range A at least ⅓ of the vane length L from the inner end 12a of the vane, the distance B between the side surfaces 12b of the vanes and the surface 4b adjacent the inner end 4a of the pole pieces 4 is within 0.015 λ wherein λ is the oscillation wavelength of the magnetron, and said vane length is a distance from said one end to said inner end.

4 Claims, 3 Drawing Sheets

MAGNETRON

BACKGROUND OF THE INVENTION

The present invention relates to a magnetron which oscillates microwaves, and more particularly, to a magnetron which can effectively reduce spurious mode oscillation.

In recent years, spurious radiation control in microwave radiation devices has been getting severer. In this trend, it is hard for a magnetron which is oscillating tube to reduce spurious radiations because of its oscillating mechanism. In spite of this disadvantage, magnetrons are widely used in transmission devices such as radars because of their being inexpensive, easy to handle and having a large output. Therefore, magnetrons with reduced spurious radiations are under development.

In general, magnetrons oscillate in the main oscillation mode referred as a $\pi$ mode in which adjacent hollows have a confined phase difference of $\pi$ radian. However, magnetrons have a lot of resonant modes other than the $\pi$ mode because of their structure. The largest spurious component radiated by vane and strap magnetrons is the component referred as the ($\pi$–1) mode which produces unnecessary radiations of a frequency of about 1.1 to 2 times the oscillation frequency of the $\pi$ mode. The output level ratio between the $\pi$ mode and the ($\pi$–1) mode is usually –30 to –50 dBc or so (the decibel value compared with the fundamental wave level); however, in order to avoid interference or noise source, it is necessary to reduce spurious radiations at a higher level.

In order to reduce these spurious radiations, there is a circuit configuration as shown in FIG. 5 where the spurious oscillation waves transmitted from the antenna 51 of the magnetron 50 into the waveguide 52 together with the fundamental wave of the $\pi$ mode is attenuated by the filter 53 connected to the waveguide 52. In this illustration, the reference numerals 55, 56, and 57 represent anode shell, vane, and strap, respectively.

The available filters include a band-pass filter, a low-pass filter, and a band-rejection filter through which pass the frequency of the main oscillation mode, but do not pass the spurious component, the $\pi$–1 mode, (See Japanese Unexamined Patent Publication No. 2001-35399, for example). When these filters are placed, the fundamental wave of the $\pi$ mode which has the passband width can pass without problems, but the spurious oscillation waves of the $\pi$–1 mode which is higher in frequency than the $\pi$ mode are rejected by the filters without being transmitted in the direction of the transmission antenna.

As described hereinbefore, a magnetron requires that filters be placed in the radar set because spurious oscillation waves are radiated from the output. However, the radar set, which is usually installed at a high position in a ship or the like, must be designed to be lightweight and small. The placement of filters do not comply with the requirement of the magnetron. In addition, the filters must be processed in high precision in order to secure the amount of attenuation of waves other than the fundamental wave and to pass the fundamental wave without being attenuated. This causes the problem of making magnetrons costly.

The present invention, which has been contrived to solve these problems, has the object of providing a magnetron which can reduce spurious oscillation such as the $\pi$–1 mode which presents a problem particularly in magnetrons and can reduce spurious radiations without placing filters.

SUMMARY OF THE INVENTION

As a result of enthusiastic study on the reduction of spurious oscillation in magnetrons, the inventors of the present invention have found out that Q values of the resonances which develop spurious oscillation can be decreased so as to greatly reduce their oscillation until it hardly causes the problem of noise by forming a resonant mode which produces resonance at a frequency slightly lower than the frequency which develops spurious oscillation, while making use of the space between the side surfaces of the vanes and the pole pieces, for example. The inventors have also found out that the spurious oscillation of the $\pi$–1 mode having a large output is around 1.1 times the frequency (wavelength $\lambda$) of the fundamental wave, and that when the surface adjacent inner end of the pole pieces are positioned within 0.015 $\pi$ from the side surfaces of the vanes in the range extending from the inner end of the vanes to a point at least ⅓ of the vane length, for example, the resonance frequency of the mode resulting from the space between the side surfaces of the vanes and the pole pieces resonates at a frequency slightly lower than the $\pi$–1 mode, so as to decrease the Q value of the resonance of the $\pi$–1 mode, thereby greatly reducing the oscillation.

The magnetron of the present invention comprises: an anode comprising plural vanes whose one end is fixed on the inner wall of a cylindrical anode shell and their inner ends opposite to the one ends are radially extended toward the center of the anode shell, and of plural hollow confined spaces formed between adjacent ones of the plural vanes; a cathode provided at the center of the anode; and a pair of pole pieces arranged at both sides of the side surfaces of the vanes in such a manner that a magnetic field nearly parallel to the cathode can be applied on the interaction space where the inner ends of the vanes and the cathode face with each other, wherein at least one of the pair pole pieces is so positioned that the surface adjacent the inner end of the pair pole pieces is within 0.015 $\lambda$ ($\lambda$ is the oscillation wavelength of the magnetron) from the side surfaces of the vanes in the range extending from the inner ends of the vanes to a point at least ⅓ of the vane length (the length from the above-mentioned one end to the inner end).

The side surfaces of the vanes indicate both-end parts of the vanes extending in the axial direction of the anode shell; the both-end parts of the vanes in the radius direction of the anode shell indicate the above-mentioned one end parts and the inner ends; and the vane length in the radius direction of the anode shell indicates the above-mentioned length of the vanes.

In this structure, the resonance frequency of the space formed between the side surfaces of the vanes and the inner ends of the pole pieces becomes slightly lower than the frequency of the spurious oscillation of the $\pi$–1 mode, thereby decreasing the Q value of the resonance of the $\pi$–1 mode oscillation. This realizes a magnetron which can greatly reduce the output of the $\pi$–1 mode oscillation and can almost eliminate effects as spurious without the placement of filters.

Instead of positioning the inner ends of the pole pieces close to the side surfaces of the vane, it is possible to provide metal pieces in a position within 0.015 $\lambda$ ($\lambda$ is the oscillation wavelength of the magnetron) from the side surfaces of the vanes in the range extending from the inner ends of the vanes to a point at least ⅓ the vane length (the length from the above-mentioned one end to the inner end). By doing so, it becomes possible to form the resonant mode which decreases the Q values of spurious oscillation the nonmagnetic member such as copper, while keeping an appropriate distance between the pole pieces, thereby applying an appropriate magnetic field in the interaction space. The metal pieces can be placed on the inner ends of the pole pieces or be fixed on the anode shell.

Another embodiment of the magnetron of the present invention comprises: an anode comprising plural vanes whose one end is fixed on the inner wall of a cylindrical anode shell and their inner ends opposite to the one ends are extended radially toward the center of the anode shell, and of plural hollow confined spaces formed between adjacent ones of the plural vanes; a cathode provided at the center of the anode; and a pair of pole pieces arranged at both sides of the side surfaces of the vanes in such a manner that a magnetic field nearly parallel to the cathode can be applied on the interaction space where the inner ends of the vanes and the cathode face with each other, wherein the surface adjacent the inner ends of the pole pieces or the metal pieces are arranged as opposed to the side surfaces of the vanes so that the resonance frequency of the mode resulting from the space between the side surfaces of the vanes and the surface adjacent the inner ends of the pole pieces can be a frequency between the π mode and the π−1 mode.

As a result that the surface adjacent the inner ends of the pole pieces or the metal pieces are arranged as opposed to the side surfaces of the vanes so that the resonance frequency of the mode resulting from the space between the side surfaces of the vanes and the surface adjacent the inner ends of the pole pieces can be a frequency within 250 MHz from about the lower limit of the frequency of the π−1 mode, the magnetron starts to oscillate at a frequency lower than the π−1 mode at the start-up of the application of an anode voltage so as to decrease the Q value of the resonance of the π−1 mode, while reducing the π−1 mode oscillation, which achieves further reduction of the π−1 mode oscillation.

DETAILED DESCRIPTION

Figure 1A:
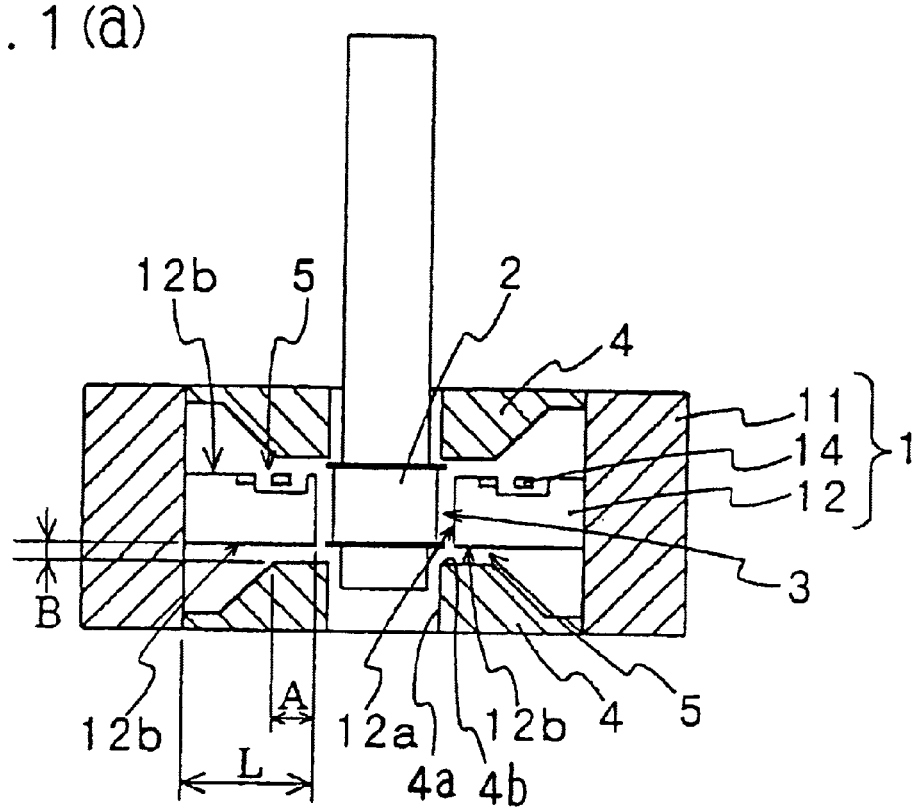
FIG. 1(a) is cross sectional views of an embodiment of the magnetron of the present invention.

The magnetron of the present invention will be described hereinafter with reference to the drawings. An embodiment of the magnetron of the present invention has a structure whose cross sectional view is shown in FIG. 1. The magnetron includes an anode 1 composed of plural vanes 12 whose one end is fixed on the inner wall of a cylindrical anode shell 11 and their inner ends 12a as opposed to the one ends are radially extended toward the center of the anode shell 11, and of confined space 13 (See FIG. 1(b)) formed between adjacent confined spaces of the vanes 12. It also includes a cathode 2 provided in the center of the anode 1, and a pair of pole pieces 4 arranged on both sides of the side surfaces 12b of the vanes 12 in such a manner that a magnetic field nearly parallel to the cathode 2 can be applied on the interaction space 3 where the inner ends 12a of the vanes 12 and the cathode 2 face with each other.

The present invention is characterized in that at least one of the pole pieces 4 is so arranged as to make the distance B between the side surface 12b of the vanes and the surface 4b adjacent inner end 4a of at least one of the pole pieces 4 not more than 0.015 λ (λ is the oscillation wavelength of the magnetron) and as not to be in contact with the vanes 12 in the range A extending from the inner ends 12a of the vanes 12 to a point at least ⅓ of the vane length L (the length from the above-mentioned one end to the inner end).

Figure 1B:
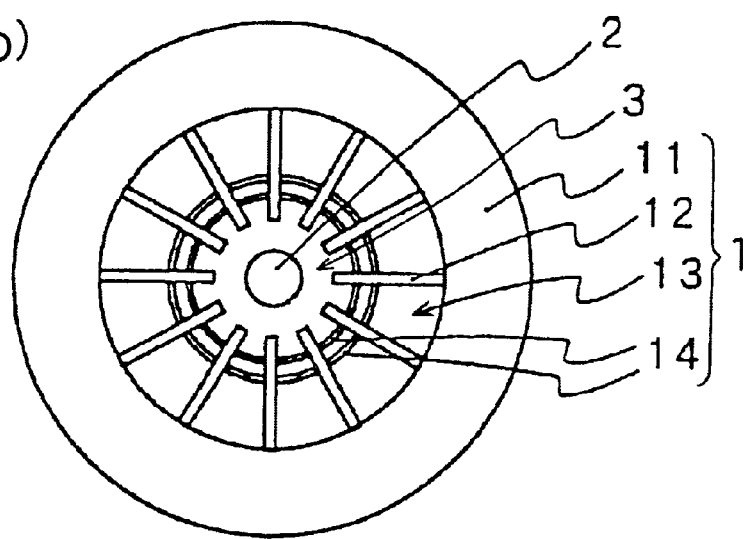
FIG. 1(b) is explanatory plan view of the embodiment of FIG. 1.

As shown in the vertical and horizontal cross sectional views of FIGS. 1(a) and 1(b), respectively, the anode 1 includes plural vanes (anode pieces) 12 which are oxygen-free copper plates whose one end is fixed on the inner wall of the anode shell 11 made of oxygen-free copper or the like and their inner ends 12a are extended towards the center of the anode shell 11, thereby forming the hollow space 13 between the vanes 12 which resonates at the desired frequency of oscillation. The every other one of the vanes 12 are connected by straps 14 so as to make their π radian phase different from each other, thereby forming a structure facilitating the π mode oscillation.

In the center of the anode shell 11 surrounded by the inner ends 12a of the vanes 12 is coaxially arranged the cathode 2, and between the inner ends 12a of the vanes 12 and the cathode 2 is formed the interaction space 3 where electrons radiated from the cathode 2 move around. In order to apply a magnetic field in the direction parallel to the cathode 2 in the interaction space 3, a pair of pole pieces 4 made of a ferromagnetic material such as iron are inserted from both sides in the axial direction of the anode shell 11 and fixed on the anode shell 11. This enables the magnetic field to be applied on the interaction space 3 by an unillustrated permanent magnet or an electromagnet, and the magnetic filed applied on the interaction space makes electrons to move around so as to give energy to the hollow space for resonation.

In the example shown in FIGS. 1(a) and 1(b), the pole pieces 4 are arranged so that the distance B between the surface 4b adjacent inner end 4a of the pole pieces 4 and the side surfaces 12b of the vanes 12 is not more than 0.015 λ when the oscillating wavelength is λ. As descried before, the anode 1 is designed so as to make the magnetron oscillate in the main oscillation mode of the π mode, and it has been found out that the magnetron oscillating in the π mode has spurious oscillating with the largest output of the π−1 mode having a frequency about 1.1 times the oscillation frequency of the magnetron, and that the magnetron can decrease the Q value of the resonation of the π−1 mode to remarkably decrease its oscillation output by forming a resonate mode which produces resonance at a frequency slightly lower than the frequency of the spurious oscillating. Then, it has also been found out that the Q value of the resonation of the π−1 mode can be decreased by setting the distance between the surface 4b adjacent inner end 4a of the pole pieces 4 and the side surfaces 12b of the vanes 12 to not more than 0.015 λ.

For example, when the main oscillation is 9.4 GHz, its wavelength λ is 31.9 mm, which makes 0.015 λ as small as about 0.48 mm. The capacity formed between them can produce resonance at a frequency lower than the oscillation frequency of the π−1 mode. With a larger distance, the resonance frequency increases and it is impossible to efficiently decrease the spurious oscillating of the π−1 mode. When the range where the distance is set is too narrow, it is impossible to reduce the spurious oscillating, so it is necessary to set the distance B over the range A extending from the inner ends 12a of the vanes 12 at least to a point over ⅓ the vane length L.

Figure 2:
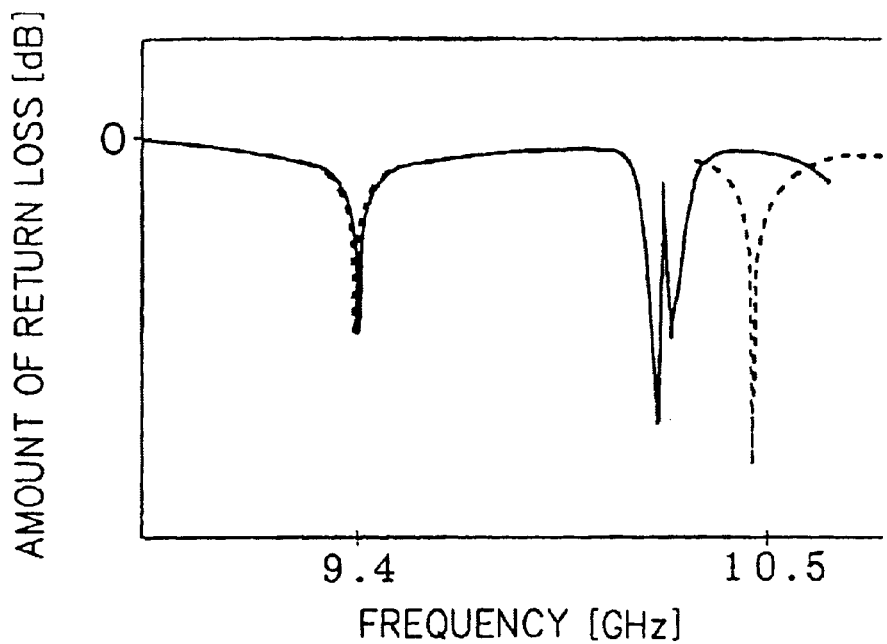
FIG. 2 is a view of the resonance properties of the magnetron shown in FIG. 1 observed by a network analyzer.

FIG. 2 shows the return loss properties of the magnetron resonator observed by a network analyzer. The horizontal axis represents frequency and the vertical axis represents the amount of return loss in decibels. The dip at the frequency 9.4 GHz in the drawing is the resonance of the π mode which is the fundamental wave. The spurious frequency of the π−1 mode which is generally the largest in the spurious components of magnetron radiation is around 10.5 GHz indicated by the dot line in FIG. 2. As indicated by the solid line in FIG. 2, when the distance B between the surface 4b adjacent inner end 4a of the pole pieces 4 and the side surfaces 12b of the vanes 12 is set to within 0.015 times the oscillation wavelength λ of the magnetron in the range A extending from the inner ends 12a of the vanes 12 to a point ⅓ the vane length L, the resonant dip of the main oscillation at 9.4 GHz appears without any change, and a new resonant mode frequency appears at a point slightly lower than the frequency of the π−1 mode, so as to decrease the Q value. As a result, oscillations with low Q values other than in the π mode are reduced so as to reduce spurious oscillation.

As described hereinbefore, even if the distance B between the side surfaces 12b of the vanes 12 and the surface 4b adjacent inner end 4a of the pole pieces 4 is not set below the above-mentioned size, the formation of a resonant mode which produces resonance at a frequency between the π mode and the π−1 mode by making use of the space between the side surfaces 12b of the vanes 12 and the pole pieces 4 can effectively prevent the oscillation of the π−1 mode. This is because, by doing so, a pulse anode voltage is applied, and before the occurrence of the π−1 mode oscillation at the rising edge, the above-mentioned resonance having a frequency at a lower point is locked, which allows the oscillation of the π mode to rise, without the π−1 mode oscillation. Therefore, the magnetron supplies good-quality microwaves having spectrum properties with reduced spurious oscillating to allow the π mode radiation as before without any obstacles and not to allow the π−1 mode radiation. In this case, adjusting the resonance frequency in the space 5 to be within 250 MHz from the lower limit of the π−1 mode (the lowest frequency among the frequencies that can be oscillated in the π−1 mode) can contribute to a reduction in the Q value, and also can further reduce spurious oscillation.

Since the pole pieces 4 are provided for the purpose of giving the interaction space 3 a magnetic field, their edge parts do not necessarily completely flat surfaces. To be more specific, even when the inner ends can be sharpened or chamfered, or far in the center in order to secure the distance from the cathode 2, the above-described effects can be obtained as long as the inner ends of the pole pieces 4 have a portion where the distance B is within 0.015 times the oscillation wavelength of the magnetron in the range extending from the inner ends 12a of the vanes 12 to a point ⅓ of the vane length L.

In the above-described example, the surface 4b adjacent inner end 4a of the pole pieces 4 are arranged close to the side surfaces 12b of the vane 12 so that the distance therebetween is shorter than the predetermined one, or are arranged so that the resonant mode resulting from the space between the side surfaces 12b of the vanes 12 and the pole pieces 4 can produce resonance at a frequency between the π mode and the π−1 mode. However, when the distance between a pair of opposed pole pieces 4 is changed as a result that the inner ends 4a of the pole pieces 4 are approached towards the vanes 12, the magnetic field pattern applied to the interaction space 3 may change and affect the oscillation properties. In such cases, it is possible to apply a metal piece 6 made from a nonmagnetic material like copper on the inner end 4a of the pole pieces 4, or to fix the metal piece 6 on the inner wall of the anode shell 11 in such a manner as to cover from the inner ends 12b of the vanes 12 to a point at least ⅓ of the vane length L, without changing the position of the inner ends 4a of the pole pieces 4.

Figure 3:
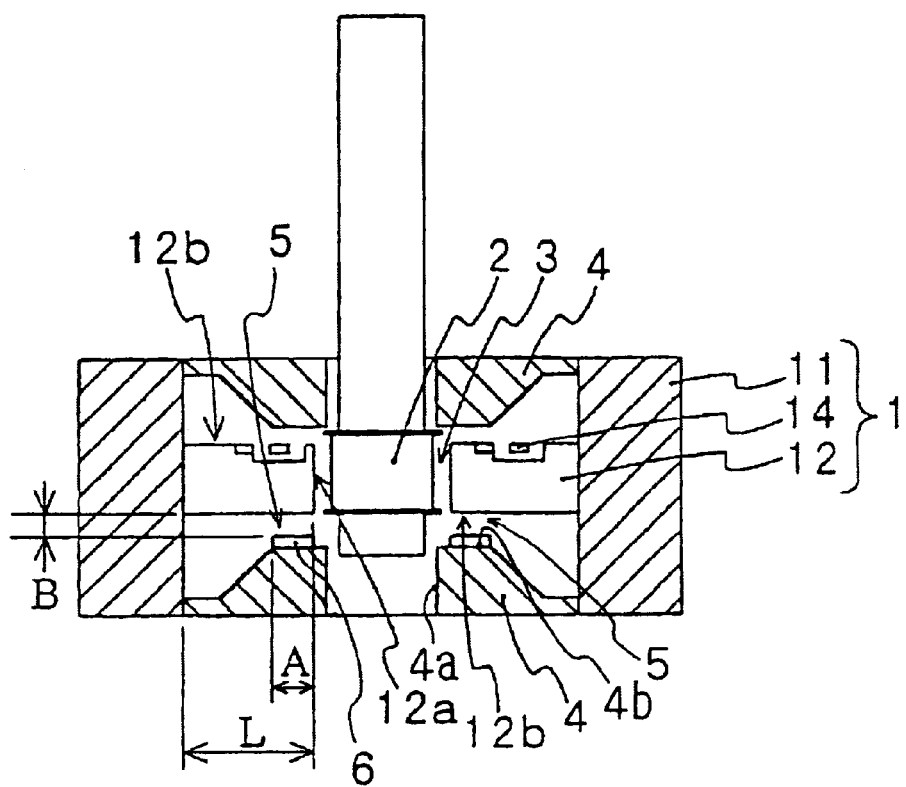
FIG. 3 is a cross sectional view of another embodiment of the magnetron of the present invention.

To be more specific, the metal piece 6 made from oxygen-free copper is applied on the inner end 4a of one of the pole pieces 4 as shown in FIG. 3 so as to make the distance B between the surface 4b adjacent inner end 4a and the side surfaces 12b of the vanes 12 not more than 0.015 λ, or the resonance frequency of the resonant mode resulting from the space 5 between the side surfaces 12b of the vanes 12 and the pole pieces 4 produces resonance at a frequency between the π mode and the π−1 mode. In other words, while the resonance frequency acts in the same manner as the case shown in FIGS. 1(a) and 1(b), the magnetic field has the same properties as the case where the pole pieces 4 are not moved because the metal piece 6 is made of a nonmagnetic material. This can reduce only the occurrence of spurious oscillating without affecting the electric properties of the π mode oscillation of the magnetron, thereby offering a magnetron with excellent spectrum properties.

Figure 4:
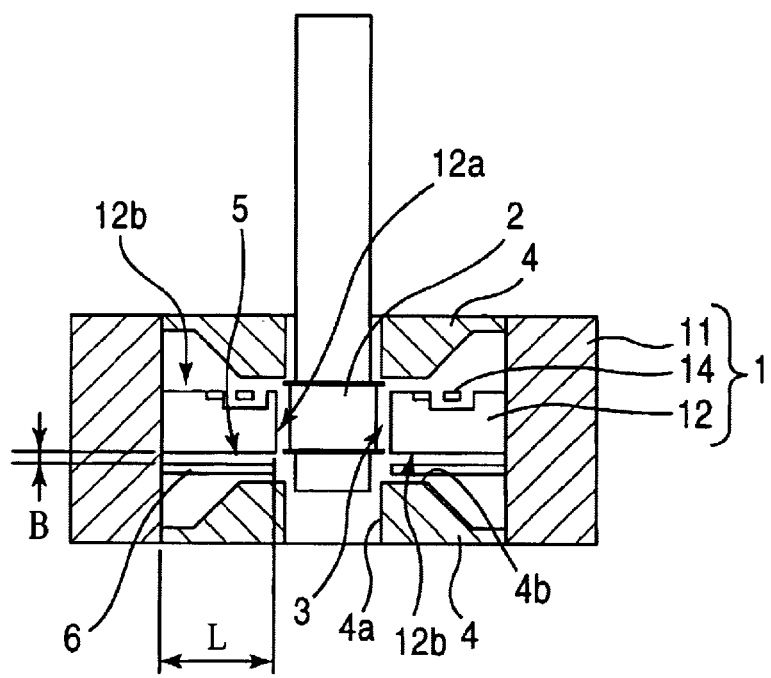
FIG. 4 is a cross sectional view of further another embodiment of the magnetron of the present invention.
Figure 5:
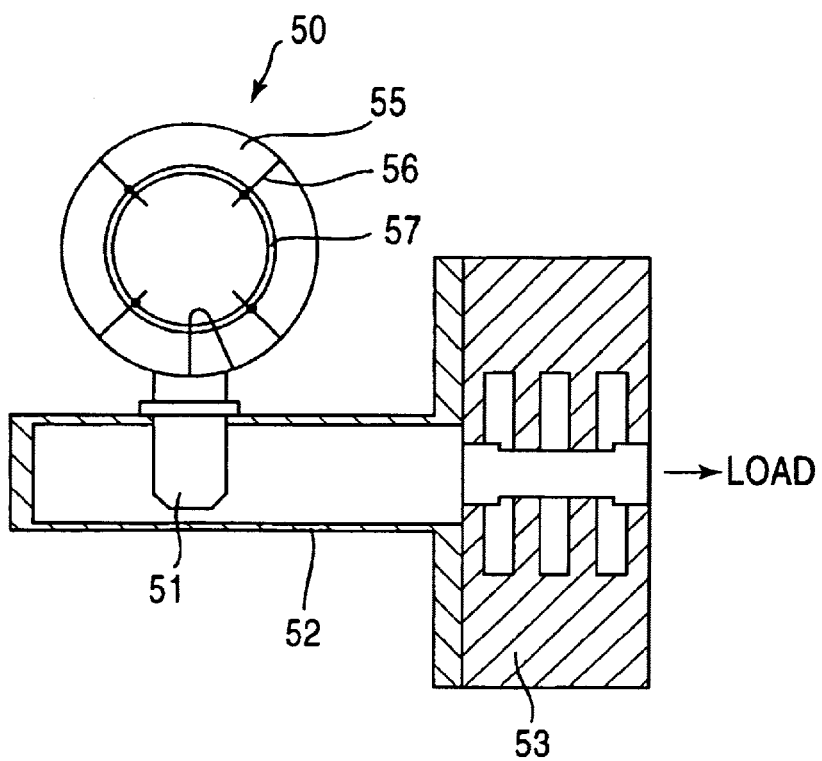
FIG. 5 is a cross sectional view of the structure of a conventional magnetron.

In the case shown in FIG. 4, the metal piece 6 is not applied on one of the pole pieces 4 but is fixed on the inner wall of the anode shell 11 and directly extended towards the center of the anode shell 11 so as to cover the range extending from the inner surfaces 12a of the vanes 12 to a point at least ⅓ of the length. This also makes it possible, through the setting of the distance B from the inner ends 12a of the vanes 12 to the predetermined size, to set the resonance frequency slightly lower than the frequency of the spurious mode, or to set the resonant mode resulting from the space 5 between the vanes 12 and the pole pieces 4 to produce resonance at a frequency between the π mode and the π−1 mode. The structures shown in FIGS. 3 and 4 are the same as the structure shown in FIG. 1 except for the metal piece 6. The same components are referred to with the same reference symbols and their description will be omitted.

In either case of FIGS. 3 and 4, the metal piece 6 can be evenly arranged through the entire circumference of the inner end 4a of one of the pole pieces 4, or can be formed in correspondence with a part of the surface of the inner end 4a of one of the pole pieces 4 in order to provide the desired properties so as to increase the capacity in part between the pole piece 4 and the vanes 12 so as to adjust the properties as a whole.

Furthermore, the adjustment of the position of the inner end parts of the pole pieces 4 or the provision of the metal piece 6 may be applied to either one or both of the facing pole pieces. It is also possible to produce resonance at different frequencies from each other on the pair pole pieces 4 so as to reduce the π−1 mode on one side and to reduce the spurious oscillating of the other modes on the other side.

As described hereinbefore, according to the present invention, it is possible to reduce the Q values of a lot of spurious resonations such as the π−1 mode, without affecting the degree of coupling or the Q value of the π mode which is the main oscillation mode. This realizes a magnetron with excellent spectrum properties which oscillates stably in the π mode and does not produce spurious oscillating. This can eliminate the use of filters which disturb the space efficiency or forces an increase in weight, thereby making the magnetron easier to use and less expensive.

Though several embodiments of the present invention are described above, it is to be understood that the present invention is not limited only to the above-mentioned, various changes and modifications may be made in the invention without departing from the spirit and scope thereof.

What is claimed is:

1. A magnetron comprising:

an anode comprising plural vanes whose one end is fixed on the inner wall of a cylindrical anode shell and their inner ends opposite to the one ends are radially extended toward the center of the anode shell, and of plural hollow confined spaces formed between adjacent ones of the plural vanes;

a cathode provided at the center of the anode; and a pair of pole pieces arranged at both sides of side surfaces of the vanes in such a manner that a magnetic field nearly parallel to the cathode can be applied on the interaction space where the inner ends of the vanes and the cathode face with each other;

wherein at least one of the pair pole pieces is so positioned that an inner end of the pair of pole pieces is within 0.015 $\lambda$ from the side surfaces of the vanes in the range extending from the inner ends of the vanes to a point at least ⅓ of the vane length;

wherein $\lambda$ is the oscillation wavelength of the magnetron, and said vane length is a distance from said one end to said inner end wherein the vane length is a distance from said one end to said inner end of a respective vane.

2. A magnetron comprising:

an anode comprising plural vanes whose one end is fixed on the inner wall of a cylindrical anode shell and their inner ends opposite to the one ends are radially extended toward the center of the anode shell, and of plural hollow confined spaces formed between adjacent ones of the plural vanes;

a cathode provided at the center of the anode; and a pair of pole pieces arranged at both sides of side surfaces of the vanes in such a manner that a magnetic field nearly parallel to the cathode can be applied on the interaction space where edge parts of the vanes and the cathode face with each other;

wherein between a surface adjacent said inner ends of said at least one of the pair pole pieces and said side surfaces of said vanes, there are provided metal pieces in a position within 0.015 $\lambda$ from the side surfaces of the vanes in the range extending from the inner ends of the vanes to a point at least ⅓ the vane length;

wherein $\lambda$ is the oscillation wavelength of the magnetron;

wherein the vane length is a distance from said one end to said inner end of a respective vane.

3. A magnetron comprising:

an anode comprising plural vanes whose one end is fixed on the inner wall of a cylindrical anode shell and their inner ends opposite to the one ends are extended radially toward the center of the anode shell, and of plural hollow confined spaces formed between adjacent ones of the plural vanes;

a cathode provided at the center of the anode;

and a pair of pole pieces arranged at both sides of side surfaces of the vanes in such a manner that a magnetic field nearly parallel to the cathode can be applied on the interaction space where the inner ends of the vanes and the cathode face with each other;

wherein the inner ends of the pole pieces are arranged as opposed to the side surfaces of the vanes so that the resonance frequency of the mode resulting from the space between the side surfaces of the vanes and surfaces adjacent the inner ends of the pole pieces can be a frequency between the $\pi$ mode and the $\pi-1$ mode.

4. The magnetron of claim 3, wherein the surfaces adjacent the inner ends of the pole pieces are arranged as opposed to the side surfaces of the vanes so that the resonance frequency of the mode resulting from the space between the side surfaces of the vanes and the surface adjacent the inner ends of the pole pieces can be a frequency within 250 MHz from about the lower limit of the frequency of the $\pi-1$ mode.

* * * * *